United States Patent [19]

Kashkooli et al.

[11] 4,151,635

[45] May 1, 1979

[54] METHOD FOR MAKING A COMPLEMENTARY SILICON GATE MOS STRUCTURE

[75] Inventors: Faraj Y. Kashkooli, San Jose; Warren L. Brand, Cupertino, both of Calif.

[73] Assignee: Signetics Corporation, Sunnyvale, Calif.

[21] Appl. No.: 816,053

[22] Filed: Jul. 15, 1977

Related U.S. Application Data

[60] Continuation of Ser. No. 727,200, Sep. 27, 1976, abandoned, which is a division of Ser. No. 623,667, Oct. 20, 1975, abandoned, which is a continuation of Ser. No. 459,260, Apr. 9, 1974, abandoned, which is a continuation of Ser. No. 332,016, Jan. 21, 1973, abandoned, which is a continuation of Ser. No. 153,732, Jun. 16, 1971, abandoned.

[51] Int. Cl.² .................................. H01L 21/225
[52] U.S. Cl. ................................ 29/571; 148/187; 148/188; 357/42; 357/59
[58] Field of Search ................. 148/187, 188, 1.5; 357/42, 59; 29/571

[56] References Cited

U.S. PATENT DOCUMENTS

| | | | |
|---|---|---|---|
| 3,646,665 | 3/1972 | Kim | 148/187 X |
| 3,673,471 | 6/1972 | Klein | 148/187 X |
| 3,699,646 | 10/1972 | Vadasz | 148/188 |

*Primary Examiner*—G. Ozaki
*Attorney, Agent, or Firm*—Jerry A. Dinardo

[57] ABSTRACT

Complementary silicon gate MOS structure formed of a semiconductor body of silicon having a major surface with a first region of N conductivity type formed in the body and extending to the surface and a second region of P conductivity type formed in the body and extending to the surface. A P-channel MOS device is formed in the first region and an N-channel MOS device is formed in the second region to provide complementary devices in the body. Each of the P and N-channel devices has a polycrystalline gate structure in which the polycrystalline material is doped with a P-type impurity to make possible the matching of threshold voltages of both devices.

In the method, complementary MOS devices are formed by the use of two separate etching operations on the polycrystalline material and forming relatively thick layers of silicon type material on the semiconductor body in separate operations.

11 Claims, 12 Drawing Figures

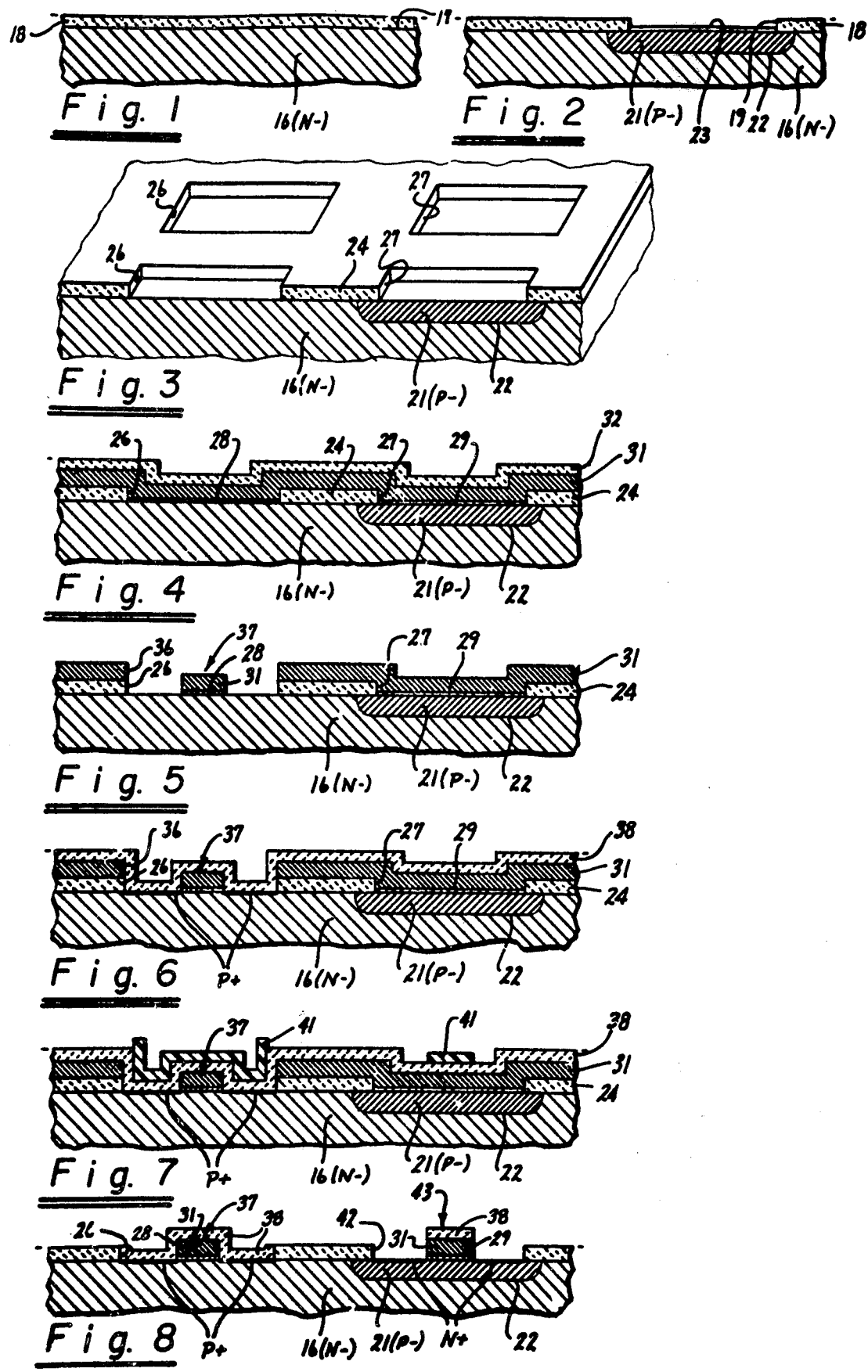

METHOD FOR MAKING A COMPLEMENTARY SILICON GATE MOS STRUCTURE

This is a continuation of application Ser. No. 727,200 filed Sept. 27, 1976, now abandoned, which was a division of Ser. No. 623,667 filed Oct. 20, 1975, now abandoned, which was a continuation of Ser. No. 459,260 filed Apr. 9, 1974, now abandoned, which was a continuation of Ser. No. 332,016, filed Jan. 21, 1973, now abandoned, which was a continuation of Ser. No. 153,732 filed June 16, 1971, now abandoned.

BACKGROUND OF THE INVENTION

1. Field of Invention

This invention relates to a semiconductor structure which can be called a complementary silicon gate metal-oxide-semiconductor, or MOS structure having a polycrystalline silicon gate doped with a P-type impurity and a method for making the same.

2. Description of Prior Art

Complementary MOS devices have heretofore been available. Such devices have had several major objections. For example, it has been necessary to provide additional interconnections. In addition, such devices had higher power consumption than desired and also were slower than desired for certain applications. There is, therefore, a need for a new and improved complementary silicon gate MOS structure and method.

SUMMARY OF THE INVENTION AND OBJECTS

The complementary silicon gate MOS structure consists of a semiconductor body of silicon having a major surface with a first region of N conductivity type formed in the body and extending to the surface and a second region of P conductivity type formed in the body in said first region and also extending to the surface. A P-channel MOS device is formed in the first region and an N-channel MOS device is formed in the second region to provide complementary devices in said body. The P and N-channel devices each have a polycrystalline gate structure in which the polycrystalline material forming part of the gate structure is doped with P-type impurities to make possible the matching of threshold voltages of both P-channel and N-channel devices.

In the method for forming the semiconductor structure, the complementary MOS devices are formed by applying a layer of polycrystalline material, etching a portion of the polycrystalline material and forming the P-channel device and thereafter etching the polycrystalline material and forming the N-channel device. Thick insulating layers are formed in two separate steps on the body and metallization is provided extending through one of the thick layers to provide the source, gate and drain contacts for the devices.

In general, it is an object of the present invention to provide a complementary silicon gate MOS structure and method which utilizes a polycrystalline material in the gate structure which is doped with a P-type impurity.

Another object of the invention is to provide a structure and method of the above character in which the polycrystalline silicon gates can be fabricated on the same substrate.

Another object of the invention is to provide a structure and method of the above character which allows higher packing densities.

Another object of the invention is to provide a structure and method of the above character which makes possible faster speeds.

Another object of the invention is to provide a structure and method of the above character in which lower threshold voltages can be obtained.

Another object of the invention is to provide a structure and method of the above character in which it is possible to match the threshold voltages of the devices.

Another object of the invention is to provide a structure of the above character which has less power dissipation.

Another object of the invention is to provide a method of the above character in which the structure can be readily fabricated.

Additional objects and features of the invention will appear from the following description in which the preferred embodiment is set forth in detail in conjunction with the accompanying drawing.

BRIEF DESCRIPTION OF THE DRAWING

FIGS. 1–9 are partial cross-sectional views illustrating the method which is utilized for fabricating the structure incorporating the present invention.

DESCRIPTION OF THE PREFERRED EMBODIMENT

Figure 9:
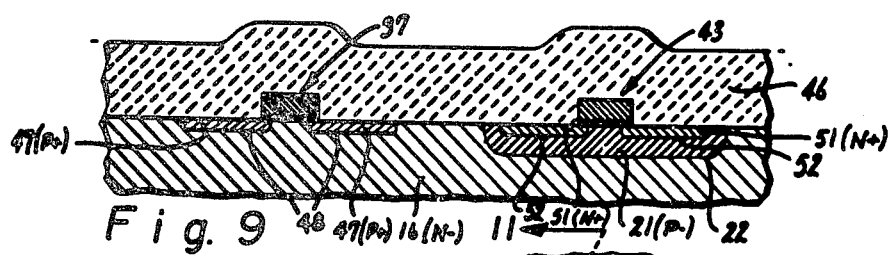

The complementary silicon gate MOS structure is fabricated by taking a semiconductor body 16 preferably formed of <111> N-type silicon. However, if desired, <100> oriented N-type silicon can be used. The body 16 can be in the form of a conventional silicon wafer having a resistivity ranging typically from 5 to 10 ohm cm. The body or wafer 16 is provided with a major planar surface 17. This surface 17 is cleaned and thereafter a layer 18 of a suitable insulating material, such as silicon dioxide, is formed on the surface 17. Typically, this can be thermally grown in a conventional manner to a suitable thickness as, for example, 6000 Angstroms. Windows or openings 19 are then formed in the oxide layer 18 by use of a first mask and conventional photolithographic techniques to define the areas which will become P-beds for the N-channel devices in the wafer. As shown in FIG. 2, the openings or windows 19 extend through the oxide layer 18 and expose the top surface 17. A suitable P-type impurity, such as boron, is then driven through the windows or openings 19. This is conventionally accomplished by a predeposition step and then a subsequent drive-in step at an elevated temperature to form a region 21 in the semiconductor body which is defined by a dish-shaped P-N junction 22 that extends to the surface beneath the oxide layer 18 as shown particularly in FIG. 2. During the drive-in of the P-bed, a layer 23 of thermally grown silicon dioxide will form in the opening 19 as shown in FIG. 2. Thereafter, the oxide layers 18 and 23 can be stripped from the surface 17 and a new thermally grown oxide layer 24, shown in FIG. 3, can be provided on the surface 17. Alternatively, after the predeposition step of the P- material, the oxide layer 18 can be stripped by the use of a suitable etchant and thereafter the P-bed can be driven in. Any thermally grown oxide which grows can then be stripped and thereafter a new oxide layer 24 can be thermally grown on the surface 17.

A second mask is utilized for forming windows or openings 26 and windows or openings 27 which extend through the oxide layer 24 and expose the surface 17 by the use of suitable photolithographic techniques. The openings or windows 26 are for the active regions of the P-channel devices, whereas the windows 27 are for the active regions of the N-channel devices. Gate oxide layers 28, shown in FIG. 4, are formed in the openings or windows 26 and gate oxide layers 29 are formed in the openings or windows 27. These layers 28 and 29 are thermally grown and have a relatively precise thickness. For example, the thickness of the gate oxide typically can vary from 1300 to 1400 Angstroms. During the time that the gate oxide is being thermally grown, the thickness of the oxide layer 24 will also increase.

After the gate oxide layers 28 and 29 have been formed, a layer 31 of polycrystalline silicon is deposited on the layer 24 and in the openings 26 and 27 over the gate oxide layers 28 and 29. The deposition of the polycrystalline material is accomplished in a conventional manner such as by the reaction of silane and hydrogen at an elevated temperature. The polycrystalline material is deposited to a depth of approximately 7000 Angstroms. Thereafter, a vapor deposited layer 32 of silicon dioxide is formed by the reaction of silane and oxygen at low temperature and has a thickness of 1500 to 2000 Angstroms.

A third mask is now utilized for forming openings 36 for the P MOS device gates. The oxide layer 32 is etched away with a suitable etch which selectively only attacks the silicon dioxide. Thereafter, the remaining silicon dioxide is utilized as a mask and a different conventional etch is utilized for etching away the exposed polycrystalline material. After the exposed polycrystalline material has been removed, a conventional silicon dioxide etch is utilized to remove the remainder of the oxide layer 32 and to also remove the exposed portions of the gate oxide layer 28 so that the surface 17 is exposed as shown in FIG. 5. Thus, there is provided the openings 36, each of which has a raised island or mesa 37 therein which is formed of a portion of the gate oxide layer 28 and a portion of the polycrystalline layer 31 which is to serve as a polycrystalline gate structure, what may be called a poly gate.

After the windows or openings 36 have been formed, a suitable P-type impurity such as boron is driven through the windows and into the exposed portions of the surface 17 and into the exposed polycrystalline layer 31 forming the poly gate to a suitable depth as, for example, one-half micron. The entire wafer is then covered with a vapor deposited masking oxide layer 38, shown in FIG. 6, by the reaction of silane and oxygen at low temperature so that it covers the exposed surfaces 17 and the remaining portions of the polycrystalline layer 31. The silicon dioxide layer 38 is typically deposited to a depth of approximately 2000 Angstroms.

A fourth mask is then utilized for forming the N MOS device gates by the use of suitable photolithographic techniques. Thus, there is provided a photoresist layer 41, shown in FIG. 7, which is exposed through the fourth mask. Thereafter, the exposed portions of the silicon dioxide layer 38 are removed by a suitable etch. The exposed portions of the polycrystalline material 31 are then etched away and thereafter the exposed portions of the gate oxide layer 29 are removed. During the time that the exposed portions of the gate oxide layer 29 are being removed, a portion of the vapor deposited layer 38 will remain on top of the N MOS device poly gate structure 43 as shown particularly in FIG. 8. Thus, there are provided windows or openings 42 which expose the surface 17 of the N-material in which there are provided raised islands or mesas 43. As shown in FIG. 7, the fourth mask serves to protect the oxide layer 38 disposed within the openings 36 and protects the P MOS device gates.

An N+ impurity is then diffused through the openings 42. For example, phosphorus oxychloride ($POCl_3$) can be deposited at a suitable temperature such as 850° C. During the time that the N-type impurities are being diffused through the openings 42, the polycrystalline layer 31 forming a part of the poly gate 43 has at least its top surface protected by the vapor deposited layer 38, and while the side edges of the polycrystalline layer 31 are exposed, the limited penetration of N-type impurity through the exposed edges will not significantly alter the doping overall of the polycrystalline layer 31. This means that the polycrystalline layer 31 will substantially retain its P+ doping which it had previously received during the formation of the P MOS device gate.

After the predeposition of the N+ impurity, the remainder of the masking oxide layer 38, namely that overlying the poly gates for the N MOS devices is removed in a suitable manner as by dipping the wafer 16 in HF. Thereafter, a very thick layer as, for example, 8000 Angstroms of vapor deposited silicon dioxide is then formed over the remaining structure so that there is a relatively thick field oxide layer 46 overlying the entire wafer, as shown in FIG. 9. During the time that this vapor deposited oxide layer 46 is being formed, the wafer is kept at an elevated temperature as, for example, a temperature of 1070° C. during which time the P+ and N+ impurities are driven down into the semiconductor body to their final depths. Thus, there are formed spaced parallel elongate P+ source and drain regions 47 in the N-body 16 which are defined by P-N junctions 48 that are dish-shaped in cross-section and which define a channel therebetween underlying the gate oxide 28. Similarly, for the N MOS devices, the N+ impurities are driven down to form elongate spaced parallel N+ source and drain regions 51 defined by P-N junctions 52 which are dish-shaped in cross-section and that extend to the surface 17 and that are disposed within the P-region 21. The regions 51 define a channel therebetween underlying the gate oxide 29. The regions 47 and 51 are driven to a suitable depth, as for example, 1 to 1½ microns.

Prior to the drive-in of the N+ and P+ regions, the field oxide layer 46 can be stabilized. This surface stabilization can be accomplished by driving in phosphorus at a temperature of 850° C. and thereafter annealing the surface at a temperature of 920° C. in an oxygen and nitrogen atmosphere.

Figure 10:
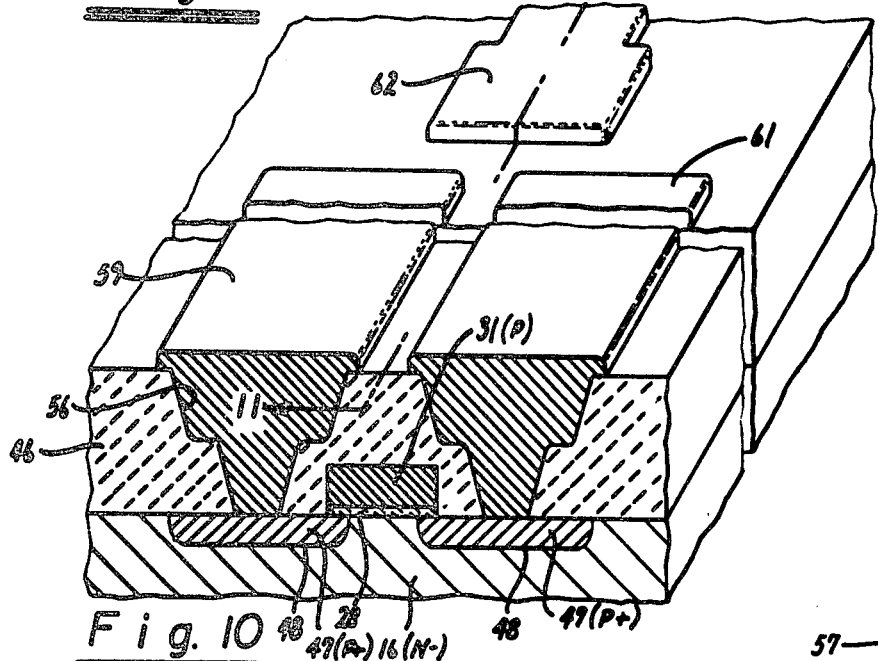
FIG. 10 is an enlarged partial isometric view showing the next step in the fabrication of the structure.
Figure 11:
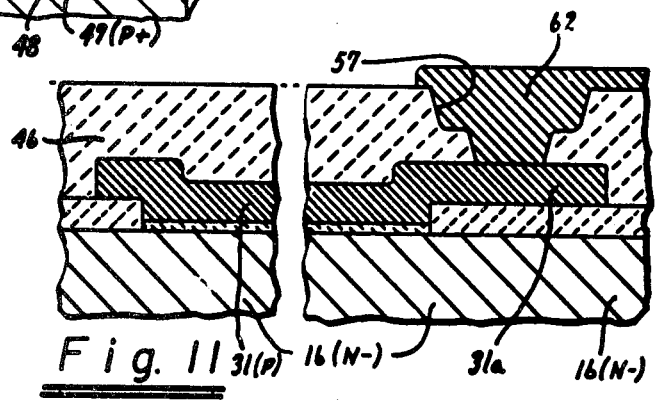
FIG. 11 is a cross-sectional view taken along the line 11—11 of FIG. 10.

A fifth mask, which is called a contact mask, is then utilized with conventional photolithographic techniques for forming openings 56 which extend through the deep field oxide 46 as shown in FIG. 10 to expose portions of the surface 17 overlying the regions 47 and 51. At the same time, openings 57 are formed for making contact to the gate as shown in FIG. 11. Thereafter, a suitable metal such as aluminum is evaporated over the surface of the thick oxide layer 46 and into the openings 56 and 57. Thereafter, by utilization of a sixth mask and suitable photolithographic techniques, the undesired metal is removed so that there are provided elongate strips 59 which form the source contacts and elongate strips 61 which form the drain contacts and strips 62 which form the gate contacts. As can be seen from FIGS. 10, 11 and 12, the contact to the gate is made through an extension 31a of the boron doped polycrystalline layer 31 which extends beyond the drain and source regions. Contact is made to the extension 31a by forming an opening in the layer 46 which is also beyond the strips 59 and 61.

Figure 12:
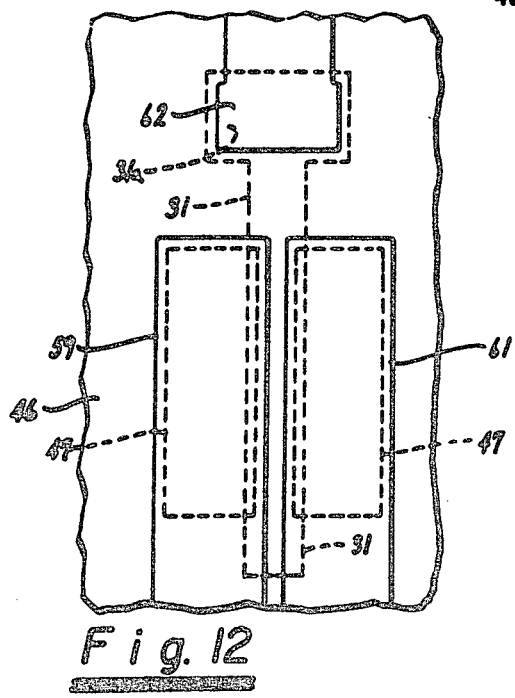
FIG. 12 is a partial plan view of a structure incorporating the present invention.

Although only one P MOS device has been shown in the drawings in FIGS. 10, 11 and 12, the same type of contact construction is utilized for the N MOS device.

It should be appreciated that, if desired, additional regions of doped polycrystalline material can be left in the field which can be utilized for interconnection purposes in an integrated circuit if so desired. Such polycrystalline interconnections will be at a lower level and will be insulated from any other metallization provided on top of the thick oxide layer 46.

From the foregoing, it can be seen that there has been provided a complementary MOS structure which can be utilized in many applications and in particular in integrated circuits. For example, two of the devices can be connected into an inverter pair by connecting the gate of the N-channel device to the drain of the P-channel device. The other leads would then be connected to a power supply and ground and to the signal source. The application of a signal would cause an inversion with very little power drain.

From the construction shown, it can be seen that both the P-channel and the N-channel devices have P+ doped polycrystalline gates which are matched so that the N-channel and P-channel devices will be fully complementary. They will also have a very low power drain and will have a very high speed in comparison to P-channel MOS devices. Also, with the construction, it is possible to obtain higher packing densities. The gates are self-aligned.

In the method of fabrication, it can be seen that different masking oxides are utilized so that they can be selectively etched and doped. The doped polycrystalline layer is etched in two separate operations. Three separate vapor depositions of oxide layers are utilized. In the N-channel device, the doped polycrystalline layer which forms a part of the poly gate is protected sufficiently so that it will retain its P+ doping.

We claim:

1. In a method for forming complementary metal-oxide-semiconductor devices in a semiconductor body having a major surface, forming a first region of first conductivity type in said body and extending to said surface, forming a second region of second conductivity type opposite said first conductivity type in the body and extending to the surface, forming a layer of masking material on said surface, forming first and second openings in said masking material exposing said major surface in areas overlying said first and second regions respectively, forming gate oxide on said surface in said first and second openings, forming a layer of polycrystalline silicon in said openings and overlying said gate oxide, forming a layer of masking material on said polycrystalline material, selectively etching said last named layer of masking material, said polycrystalline silicon layer and said gate oxide layer so that there remains a first polycrystalline gate structure in said first opening formed of a layer of polycrystalline material overlying a layer of said gate oxide flanked by exposed areas of said major surface, and so that there remains in said second opening a layer of polycrystalline material overlying said gate oxide, diffusing a second type impurity into the exposed portions of said surface in said first opening and into the polycrystalline layer, forming a layer of masking material in said first and second openings covering said polycrystalline gate structure and said layer of polycrystalline material, selectively etching away the last named layer of masking material and said polycrystalline layer and said gate oxide so that there remains in said second opening a second polycrystalline gate structure flanked by exposed areas of said major surface with said second polycrystalline gate structure being formed of a layer of gate oxide, a polycrystalline layer overlying said layer of gate oxide and a masking layer overlying said polycrystalline layer, and so that there remains in said first opening a layer of said masking material covering said first polycrystalline gate structure and the surrounding areas of said major surface, diffusing a second type impurity into the exposed surface areas in the second opening while the polycrystalline layer surface of each of the first and second polycrystalline gate structures is protected by the masking layer, removing the masking layer, forming a thick layer of insulating material in said first and second openings, and forming openings extending through said thick layer of insulating material to form source, drain and gate contacts for the complementary devices.

2. A method as in claim 1, wherein said first conductivity type is N type and said second conductivity type is P type.

3. A method as in claim 2 wherein the P-type and N-type regions for the complementary devices are driven to their final depths during and after depositing of the thick layer of insulating material.

4. In a method for forming a complementary silicon gate metal-oxide-semiconductor structure in a semiconductor body having an N-type impurity therein, defining a first portion in said body for locating a P-channel device and a second portion in said body for locating an N-channel device, forming a P-type region in said second body portion, forming first and second polycrystalline gate structures over said first and second body portions for the P-type and N-type channel devices respectively, diffusing a P-type impurity into the polycrystalline layer of each of the polycrystalline gate structures and into the first body portion to form the P-type regions of the P-channel device, diffusing an N-type impurity into the second body portion to form the N-type regions of the N-channel device, and protecting the polycrystalline gate surface structure from an N-type impurity during the time that an N-type impurity is being diffused.

5. A method as in claim 4 wherein the diffusion of the P-type impurity into the polycrystalline layers of the polycrystalline gate structures is carried out simultaneously.

6. A method as in claim 5 wherein the diffusion of the P-type material in the polycrystalline gate material is carried out during the time that the P-type impurity is being diffused to form the P-type regions of the P-channel device.

7. A method of fabricating complementary metal-oxide-semiconductor devices, comprising:

(a) providing in a semiconductor body of first conductivity type a surface region of second conductivity type opposite said first conductivity type,
(b) forming a first polysilicon gate layer spaced by an insulator from a surface portion of said semiconductor body and spaced from said surface region,
(c) forming a second polysilicon gate layer spaced by an insulator from said surface region and spaced from said first polysilicon gate layer,
(d) exposing both said polysilicon gate layers and oppositely located exposed areas of said semiconductor surface portion to an impurity dopant of said second conductivity type, while said surface region is covered by said second polysilicon gate layer, to match the conductivities of said polysilicon gate layers and to form source and drain regions for a first one of said devices,
(e) removing oppositely located portions of said second polysilicon gate layer and underlying insulator to expose spaced areas of said surface region where source and drain regions are to be located for a second one of said devices,
(f) exposing said spaced areas of said surface region to an impurity dopant of said first conductivity type, while masking the gate layer and source and drain regions of said first device and while masking at least the major surfaces of said second gate layer, to form the source and drain regions of said second device, and
(g) forming source, drain and gate contacts for each of said devices.

8. The invention according to claim 7, wherein said first conductivity type is N type and said second conductivity type is P type.

9. The invention according to claim 7 and further including, between steps (f) and (g), the step of covering the entire structure then formed with a thick vapor deposited oxide layer.

10. The invention according to claim 9 wherein said oxide layer is deposited at a sufficiently high temperature to drive the impurity dopants in the source and drain regions of both devices further into the semiconductor body.

11. The invention according to claim 9 wherein step (g) is performed by opening contact holes in said oxide layer and depositing metal conductors extending over said oxide layer and into said holes to contact the source and drain regions and the polysilicon gate layers.

* * * * *